United States Patent [19]

McCown

[11] 3,967,102

[45] June 29, 1976

[54] SELF-ADJUSTING DIGITAL NOTCH FILTER

[75] Inventor: Rainer F. McCown, Columbia, Md.

[73] Assignee: The United States of America as represented by the Secretary of the Air Force, Washington, D.C.

[22] Filed: Mar. 25, 1975

[21] Appl. No.: 561,962

[52] U.S. Cl. ............................. 235/152; 328/167; 333/17 R; 333/70 R; 333/76; 343/7.7
[51] Int. Cl.² .................... G06F 15/34; H03H 7/10
[58] Field of Search........... 235/152, 156; 333/17 R, 333/70 R, 70 A, 70 S, 76, 79; 328/149, 167; 324/77 R, 77 B; 343/7.7

[56] References Cited
UNITED STATES PATENTS

| | | | |
|---|---|---|---|
| 3,355,668 | 11/1967 | Boensel et al. | 328/167 |
| 3,375,451 | 3/1968 | Borelli et al. | 333/70 R X |
| 3,659,212 | 4/1972 | Saliga | 328/167 |
| 3,867,712 | 2/1975 | Harthill et al. | 333/17 R X |
| 3,868,605 | 2/1975 | Poole | 333/76 |

Primary Examiner—Malcolm A. Morrison
Assistant Examiner—Jerry Smith
Attorney, Agent, or Firm—Joseph E. Rusz; Willard R. Matthews, Jr.

[57] ABSTRACT

Digital filter auto-adjustment to variations in input signals is achieved by normalizing the output of the second of two substantially identical series-connected digital filter stages and subtracting the normalized output of the second filter stage from its input to provide a measure of filter signal residue power. Deviations of the signal residue power from the preset limits of a signal residue power standard are detected and signals responsive thereto are used to appropriately adjust variable bandwidth constants in both filter stages.

2 Claims, 3 Drawing Figures

SELF-ADJUSTING DIGITAL NOTCH FILTER

STATEMENT OF GOVERNMENT INTEREST

The invention described herein may be manufactured and used by or for the Government for governmental purposes without the payment of any royalty thereon.

BACKGROUND OF THE INVENTION

This invention relates to digital filters, and in particular to a digital notch (band stop) filter that is capable of monitoring the skirts of the signal it is rejecting and readjusting itself to maintain the desired residue in the passband. Previously, adjustable notch filters were adjusted on the basis of open loop calculations, by additional pieces of equipment designed to measure the leakage (i.e., a bandpass filter adjacent to the notch filter), or by noting that leakage is interfering with the following processing steps. Such methods of course add substantial cost and complexity to systems using filters of this type.

There currently exists, therefore, the need for simplified inexpensive self-adjusting digital filters. The present invention is directed toward satisfying this need.

SUMMARY OF THE INVENTION

The present invention comprises a technique whereby digital filters can be configured to adjust themselves with respect to the input signal. Serial and parallel notch filters are disclosed that monitor the leakage around the filter and vary their bandwidth to control the leakage to the desired level. The self-adjusting feature insures that the bandpass region will be as large as possible consistent with the input conditions. The technique is applicable to both bandpass and bandreject filters used in situations where the input signal (desired or undesired) is not precisely defined or too complex to adjust open loop.

One presently preferred embodiment of the invention comprises two series connected digital notch filter stages having means for detecting overall filter signal residue power together with a notch constant generator that is controlled in response to deviations of the signal residue power from preset limits.

It is a principal object of the invention to provide a new and improved self-adjusting digital notch filter.

It is another object of the invention to provide a digital filter that is capable of monitoring the skirts of the signal it is processing and automatically readjusting itself to maintain the desired residue in the passband.

It is another object of the invention to provide a digital notch filter of the type described that is inexpensive and less complex than currently available devices.

It is another object of the invention to provide an adjustable digital notch filter that does not require open loop calculations or additional leakage measuring equipment.

These, together with other objects, features and advantages, will become more readily apparent from the following detailed description when taken in conjunction with the illustrative embodiments in the accompanying drawings.

DETAILED DESCRIPTION OF THE PREFERRED EMBODIMENTS

It is a basic concept of the invention that a notch filter can be converted to a bandpass filter of generally the inverse shape by subtracting the normalized output of the filter from the input. If a second notch filter is applied to the input signal as the first stage then the "inverse" output of the second stage gives a measure of the residue from the first stage and the normal output will improve the notch characteristic of the overall filter. By monitoring this residue signal it can easily be determined if the notch widths should be readjusted to provide the desired total rejection. This technique is also applicable to many bandpass filter mechanizations where it is desired to match the passband to the signal bandwidth.

Basically, this technique will work with any filter mechanization complex enough to require at least two stages of filtering. Filters arranged in series or in parallel can make use of this technique with only slight modifications of the typical design described below.

Figure 1:
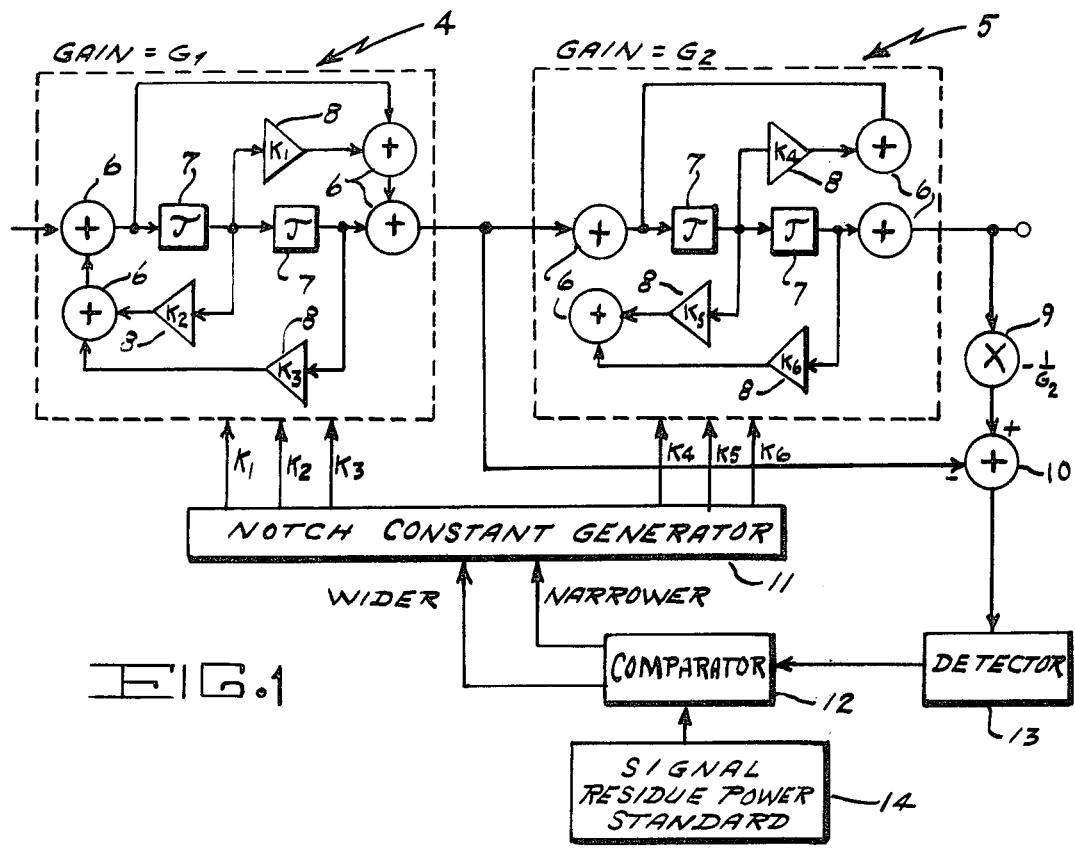
FIG. 1 is a schematic diagram of one presently preferred embodiment of the invention employing series connected digital notch filters.

FIG. 1 is a block diagram of a four-pole series recursive digital filter with the additional hardware needed to perform the self-adjusting function. This type of filter is commonly used as a clutter notch filter in moving target indicating (MTI) radar systems. The filter comprises the series connected combination of first stage two-pole recursive filter 4 and second stage two-pole recursive filter 5. Filters 4 and 5 are conventional digital notch filters with circuits consisting of the arrangements of adders 6, delays 7, and notch constants 8, illustrated in FIG. 1.

Figure 2:
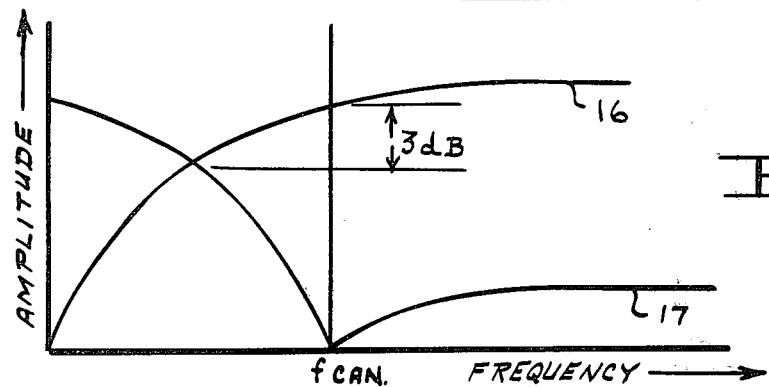
FIG. 2 is a graph illustrating curves for the digital filters of FIG. 1.

To perform the self-adjusting function only a few extra parts are required in addition to the original digital filter. These comprise normalizing multiplier 9, differencing means 10, detector 13, signal residue power standard 14, comparator 12 and notch constant generator 11. The normalizing multiplier constant is chosen to perform exact cancellation at the part of the filter transfer characteristic where maximum cancellation is desired. Usually this point is chosen such that the midband rejection is only as great as is needed and the maximum rejection is closer to the passband. This results in a spectrum as shown by normal filter curve 16 and inverted filter curve 17 of FIG. 2. The residue filter has the same 3 db width as the notch band filter if the gain normalization is chosen for the midband frequency.

By moving the normalization point closer to the stop band a narrower residue filter is produced. After normalization the subtraction operation is performed by differencing means 10 to form the actual filter. The detector 13 is used to measure the signal (residue) power in this filter and its output is then compared by comparator 12 to the limits selected in signal residue standard 14 for the residue power. If the detected signal falls outside of the specified limits a signal is generated by notch constant generator 11 to change the notch constants in the notch filter.

Figure 3:
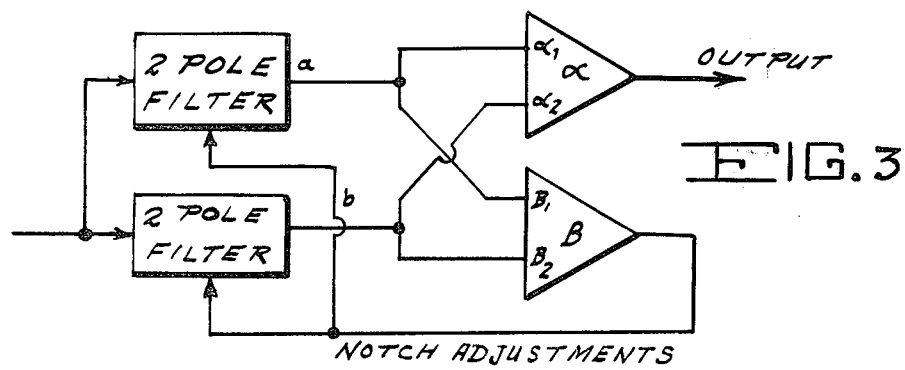
FIG. 3 is a block diagram of an equivalent four-pole filter arranged in parallel.

FIG. 3 is a block diagram of an equivalent four-pole recursive filter arranged in parallel. By combining the outputs "$a$ and $b$" in several ways equivalent responses to series filter can be obtained. Therefore, this filter type can also be made self-adjusting by the disclosed techniques.

While the invention has been described in one presently preferred embodiment, it is understood that the words which have been used are words of description rather than words of limitation and that changes within the purview of the appended claims may be made without departing from the scope and spirit of the invention in its broader aspects.

What is claimed is:

1. The method of filtering a signal comprising the steps of filtering said signal with a first digital filter having given bandwidth characteristics, filtering the output of said first digital filter with a second digital filter having substantially the same bandwidth characteristics as said first digital filter, normalizing the output of said second digital filter, subtracting the normalized output of said second digital filter from its input to obtain the filter signal residue power, and varying the bandwidth control constants of said first and second digital filters in response to deviations between said signal residue power and limits defined by a signal residue power standard.

2. A self-adjusting digital notch filter comprising a first digital filter stage having variable notch constants, a second digital filter stage having variable notch constants, the output of said first filter stage being connected to the input of said second filter stage, means for normalizing the output of said second filter stage, differencing means for subtracting the normalized output of said second filter stage from its input to provide a measure of the filter signal residue power, a signal residue power standard having selected signal residue power limits, comparator means adapted to measure deviations between the output of said differencing means and the limits of said signal residue power standard, and a notch constant generator adapted to control the values of first and second filter stage notch constants in response to the output of said comparator means.

* * * * *